US011139780B2

(12) United States Patent
Khlat (10) Patent No.: US 11,139,780 B2
(45) Date of Patent: Oct. 5, 2021

(54) ENVELOPE TRACKING APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 33 days.

(21) Appl. No.: 16/660,900

(22) Filed: Oct. 23, 2019

(65) Prior Publication Data

US 2020/0343859 A1 Oct. 29, 2020

Related U.S. Application Data

(60) Provisional application No. 62/837,876, filed on Apr. 24, 2019.

(51) Int. Cl.
*H03F 3/04* (2006.01)
*H03F 1/02* (2006.01)
(Continued)

(52) U.S. Cl.
CPC ............... *H03F 1/02* (2013.01); *H03F 3/24* (2013.01); *H01Q 21/24* (2013.01); *H01Q 23/00* (2013.01);
(Continued)

(58) Field of Classification Search
CPC ........ H03F 1/02; H03F 3/24; H03F 2200/451; H03F 2200/102; H03F 3/68; H03F 3/245; H03F 3/19; H03F 1/0222; H03F 1/0233; H03F 1/0244; H03F 1/3247; H03F 3/193; H03F 3/21; H03F 1/0227; H03F 3/189; H03F 3/20; H03F 2200/336; H03F 2200/504; H03F 1/0211; H03F 1/305;
(Continued)

(56) References Cited

U.S. PATENT DOCUMENTS 6,529,716 B1   3/2003 Eidson et al.
6,788,151 B2   9/2004 Shvarts et al.
(Continued)

OTHER PUBLICATIONS

Non-Final Office Action for U.S. Appl. No. 16/263,368, dated Dec. 26, 2019, 6 pages.
(Continued)

*Primary Examiner* — Khanh V Nguyen
(74) *Attorney, Agent, or Firm* — Withrow & Terranova, PLLC (57) ABSTRACT

An envelope tracking (ET) apparatus is provided. The ET apparatus includes an amplifier array(s) configured to amplify a radio frequency (RF) signal(s) based on an ET voltage(s). The ET apparatus also includes a distributed voltage amplifier (DVA) circuit(s), which may be co-located with the amplifier array(s) to help reduce trace inductance between the DVA circuit(s) and the amplifier array(s), configured to generate the ET voltage(s) based on an ET target voltage(s). The ET apparatus further includes a signal processing circuit configured to receive an analog signal(s) corresponding to the RF signal(s) and generates the ET target voltage(s) based on the analog signal. By employing a single signal processing circuit to generate the ET target voltage(s) for the amplifier array(s), it may be possible to reduce a footprint of the ET apparatus without compromising efficiency and/or increasing heat dissipation of the amplifier array(s).

19 Claims, 2 Drawing Sheets

(51) Int. Cl.
*H03F 3/24* (2006.01)
*H01Q 21/24* (2006.01)
*H01Q 23/00* (2006.01)

(52) U.S. Cl.
CPC ...... *H03F 1/0244* (2013.01); *H03F 2200/102* (2013.01); *H03F 2200/451* (2013.01)

(58) Field of Classification Search
CPC ...... H03F 3/04; H03F 2200/507; H03F 3/602; H03F 3/607; H01Q 21/24; H01Q 23/00; G01R 1/30; H03G 3/004; H03G 3/3042
USPC .......................................... 330/136, 286, 297
See application file for complete search history.

(56) References Cited

U.S. PATENT DOCUMENTS

| | | |
|---|---|---|
| 8,019,289 B2 | 9/2011 | Gorbachov |
| 8,290,453 B2 | 10/2012 | Yoshihara |
| 8,385,859 B2 | 2/2013 | Hamano |
| 8,476,976 B2 | 7/2013 | Wimpenny |
| 8,598,950 B2 | 12/2013 | Khesbak |
| 8,600,321 B2 | 12/2013 | Nambu et al. |
| 8,611,402 B2 | 12/2013 | Chiron |
| 8,665,016 B2 | 3/2014 | Chowdhury et al. |
| 8,665,931 B2 | 3/2014 | Afsahi et al. |
| 8,803,603 B2* | 8/2014 | Wimpenny ........... H03F 1/0222 330/124 R |
| 8,816,272 B1 | 8/2014 | Brown et al. |
| 8,816,768 B2 | 8/2014 | Tseng et al. |
| 8,818,305 B1 | 8/2014 | Schwent et al. |
| 8,921,774 B1 | 12/2014 | Brown et al. |
| 8,942,651 B2 | 1/2015 | Jones |
| 8,989,682 B2 | 3/2015 | Ripley et al. |
| 9,002,303 B2 | 4/2015 | Brobston |
| 9,065,509 B1 | 6/2015 | Yan et al. |
| 9,197,162 B2 | 11/2015 | Chiron et al. |
| 9,197,256 B2 | 11/2015 | Khlat |
| 9,246,460 B2 | 1/2016 | Khlat et al. |
| 9,247,496 B2 | 1/2016 | Khlat |
| 9,270,230 B2 | 2/2016 | Henshaw et al. |
| 9,287,829 B2 | 3/2016 | Nobbe et al. |
| 9,288,098 B2 | 3/2016 | Yan et al. |
| 9,294,043 B2 | 3/2016 | Ripley et al. |
| 9,374,005 B2 | 6/2016 | Rozek et al. |
| 9,379,667 B2 | 6/2016 | Khlat et al. |
| 9,438,172 B2 | 9/2016 | Cohen |
| 9,515,621 B2 | 12/2016 | Hietala et al. |
| 9,515,622 B2 | 12/2016 | Nentwig et al. |
| 9,516,693 B2 | 12/2016 | Khlat et al. |
| 9,571,152 B2 | 2/2017 | Ripley et al. |
| 9,596,110 B2 | 3/2017 | Jiang et al. |
| 9,614,476 B2 | 4/2017 | Khlat |
| 9,614,477 B1 | 4/2017 | Rozenblit et al. |
| 9,641,206 B2 | 5/2017 | Pratt et al. |
| 9,671,801 B2 | 6/2017 | Bhattad et al. |
| 9,743,357 B2 | 8/2017 | Tabe |
| 9,831,834 B2 | 11/2017 | Balteanu et al. |
| 9,831,934 B2 | 11/2017 | Kotecha et al. |
| 9,843,294 B2 | 12/2017 | Khlat |
| 9,859,845 B2 | 1/2018 | Sarbishaei et al. |
| 9,912,296 B1 | 3/2018 | Cheng et al. |
| 9,912,297 B2 | 3/2018 | Khlat |
| 9,912,301 B2 | 3/2018 | Xue et al. |
| 9,941,844 B2 | 4/2018 | Khlat |
| 9,948,240 B2 | 4/2018 | Khlat et al. |
| 9,954,436 B2 | 4/2018 | Khlat |
| 9,960,737 B1 | 5/2018 | Kovac |
| 9,974,050 B2 | 5/2018 | Wiser et al. |
| 9,991,851 B1 | 6/2018 | Dinur et al. |
| 9,991,856 B2 | 6/2018 | Khesbak et al. |
| 9,991,913 B1 | 6/2018 | Dinur et al. |
| 10,003,303 B2 | 6/2018 | Afsahi et al. |
| 10,069,470 B2 | 9/2018 | Khlat et al. |
| 10,090,809 B1 | 10/2018 | Khlat |
| 10,097,387 B1 | 10/2018 | Wiser et al. |
| 10,103,926 B1 | 10/2018 | Khlat |
| 10,110,169 B2 | 10/2018 | Khesbak et al. |
| 10,141,891 B2 | 11/2018 | Gomez et al. |
| 10,158,330 B1* | 12/2018 | Khlat ....................... H03F 3/211 |
| 10,171,037 B2 | 1/2019 | Khlat |
| 10,171,038 B1 | 1/2019 | Chen et al. |
| 10,181,826 B2 | 1/2019 | Khlat et al. |
| 10,204,775 B2 | 2/2019 | Brown et al. |
| 10,305,429 B2 | 5/2019 | Choo et al. |
| 10,326,408 B2 | 6/2019 | Khlat et al. |
| 10,355,646 B2 | 7/2019 | Lee et al. |
| 10,361,660 B2* | 7/2019 | Khlat ....................... H03F 3/193 |
| 10,382,147 B2 | 8/2019 | Ripley et al. |
| 10,396,716 B2 | 8/2019 | Afsahi et al. |
| 10,419,255 B2 | 9/2019 | Wiser et al. |
| 10,432,145 B2 | 10/2019 | Khlat |
| 10,439,557 B2 | 10/2019 | Khlat et al. |
| 10,439,789 B2 | 10/2019 | Brunel et al. |
| 10,454,428 B2 | 10/2019 | Khesbak et al. |
| 10,476,437 B2 | 11/2019 | Nag et al. |
| 10,622,948 B2* | 4/2020 | Khlat ......................... H03F 3/19 |
| 10,630,375 B1* | 4/2020 | Khlat ................. H04B 7/15535 |
| 10,903,796 B2* | 1/2021 | Khlat ....................... H03F 3/24 |
| 2004/0100323 A1 | 5/2004 | Khanifer et al. |
| 2009/0128236 A1 | 5/2009 | Wilson |
| 2009/0253389 A1 | 10/2009 | Ma et al. |
| 2011/0223875 A1 | 9/2011 | Hamano |
| 2012/0142304 A1 | 6/2012 | Degani et al. |
| 2012/0146731 A1 | 6/2012 | Khesbak |
| 2012/0194274 A1 | 8/2012 | Fowers et al. |
| 2012/0302179 A1 | 11/2012 | Brobston |
| 2012/0309333 A1 | 12/2012 | Nambu et al. |
| 2013/0141159 A1 | 6/2013 | Strange et al. |
| 2013/0207731 A1 | 8/2013 | Balteanu |
| 2013/0285750 A1 | 10/2013 | Chowdhury et al. |
| 2014/0111279 A1 | 4/2014 | Brobston |
| 2014/0218109 A1 | 8/2014 | Wimpenny |
| 2014/0306763 A1 | 10/2014 | Hong et al. |
| 2014/0306769 A1 | 10/2014 | Khlat et al. |
| 2014/0361837 A1 | 12/2014 | Strange et al. |
| 2015/0009980 A1 | 1/2015 | Modi et al. |
| 2015/0091645 A1 | 4/2015 | Park et al. |
| 2015/0123628 A1 | 5/2015 | Bhattad et al. |
| 2015/0194988 A1 | 7/2015 | Yan et al. |
| 2015/0236729 A1 | 8/2015 | Peng et al. |
| 2016/0036389 A1 | 2/2016 | Balteanu et al. |
| 2016/0050629 A1 | 2/2016 | Khesbak et al. |
| 2016/0094185 A1 | 3/2016 | Shute |
| 2016/0094186 A1 | 3/2016 | Cohen |
| 2016/0105151 A1 | 4/2016 | Langer |
| 2016/0181995 A1 | 6/2016 | Nentwig et al. |
| 2016/0204809 A1 | 7/2016 | Pratt et al. |
| 2016/0226448 A1 | 8/2016 | Wimpenny |
| 2016/0294587 A1 | 10/2016 | Jiang et al. |
| 2017/0070199 A1 | 3/2017 | Anderson et al. |
| 2017/0077877 A1 | 3/2017 | Anderson |
| 2017/0093340 A1 | 3/2017 | Khesbak |
| 2017/0207802 A1 | 7/2017 | Pratt et al. |
| 2017/0230924 A1 | 8/2017 | Wolberg et al. |
| 2017/0279412 A1 | 9/2017 | Afsahi et al. |
| 2017/0353287 A1 | 12/2017 | Onaka et al. |
| 2018/0048276 A1 | 2/2018 | Khlat et al. |
| 2018/0138862 A1 | 5/2018 | Balteanu et al. |
| 2018/0138863 A1 | 5/2018 | Khlat |
| 2018/0159476 A1 | 6/2018 | Balteanu et al. |
| 2018/0159566 A1 | 6/2018 | Dinur et al. |
| 2018/0287564 A1 | 10/2018 | Afsahi et al. |
| 2018/0309409 A1 | 10/2018 | Khlat |
| 2018/0309414 A1 | 10/2018 | Khlat et al. |
| 2018/0316440 A1 | 11/2018 | Mita |
| 2018/0358930 A1 | 12/2018 | Haine |
| 2019/0036493 A1 | 1/2019 | Khlat et al. |
| 2019/0044480 A1 | 2/2019 | Khlat |
| 2019/0089310 A1 | 3/2019 | Khlat et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222176 A1 | 7/2019 | Khlat |

(56) References Cited

U.S. PATENT DOCUMENTS

| | | |
|---|---|---|
| 2019/0222181 A1 | 7/2019 | Khlat |
| 2019/0267947 A1 | 8/2019 | Khlat et al. |
| 2019/0356285 A1 | 11/2019 | Khlat et al. |
| 2020/0136575 A1 | 4/2020 | Khlat et al. |
| 2020/0350878 A1 | 11/2020 | Drogi et al. |

OTHER PUBLICATIONS

Notice of Allowance for U.S. Appl. No. 16/273,288, dated Dec. 13, 2019, 8 pages.

Non-Final Office Action for U.S. Appl. No. 16/263,316, dated Dec. 23, 2019, 9 pages.

Notice of Allowance for U.S. Appl. No. 16/193,513, dated Mar. 25, 2020, 8 pages.

Non-Final Office Action for U.S. Appl. No. 16/250,229, dated Apr. 29, 2020, 7 pages.

Non-Final Office Action for U.S. Appl. No. 16/267,740, dated Apr. 30, 2020, 10 pages.

Final Office Action for U.S. Appl. No. 16/263,316, dated May 13, 2020, 10 pages.

Notice of Allowance for U.S. Appl. No. 16/270,119, dated Jun. 18, 2020, 9 pages.

Non-Final Office Action for U.S. Appl. No. 16/278,886, dated Apr. 29, 2020, 9 pages.

Quayle Action for U.S. Appl. No. 16/267,779, dated May 1, 2020, 8 pages.

Final Office Action for U.S. Appl. No. 16/263,368, dated May 22, 2020, 9 pages.

Quayle Action for U.S. Appl. No. 16/267,740, dated Oct. 19, 2020, 7 pages.

Non-Final Office Action for U.S. Appl. No. 16/263,316, dated Nov. 24, 2020, 4 pages.

Non-Final Office Action for U.S. Appl. No. 16/263,368, dated Dec. 17, 2020, 8 pages.

Notice of Allowance for U.S. Appl. No. 16/508,704, dated Dec. 30, 2020, 7 pages.

Notice of Allowance for U.S. Appl. No. 16/508,768, dated Oct. 27, 2020, 9 pages.

Quayle Action for U.S. Appl. No. 16/514,339, dated Nov. 19, 2020, 9 pages.

Notice of Allowance for U.S. Appl. No. 16/250,229, dated Sep. 22, 2020, 7 pages.

Non-Final Office Action for U.S. Appl. No. 16/263,316, dated Jul. 17, 2020, 4 pages.

Notice of Allowance for U.S. Appl. No. 16/278,886, dated Sep. 22, 2020, 8 pages.

Non-Final Office Action for U.S. Appl. No. 16/250,298, dated Aug. 20, 2020, 8 pages.

Non-Final Office Action for U.S. Appl. No. 16/263,368, dated Aug. 7, 2020, 4 pages.

Notice of Allowance for U.S. Appl. No. 16/267,740, dated Mar. 3, 2021, 8 pages.

Notice of Allowance for U.S. Appl. No. 16/263,316, dated Mar. 30, 2021, 7 pages.

Quayle Action for U.S. Appl. No. 16/250,298, dated Feb. 3, 2021, 5 pages.

Notice of Allowance for U.S. Appl. No. 16/250,298, dated Apr. 15, 2021, 8 pages.

Non-Final Office Action for U.S. Appl. No. 16/689,236, dated Mar. 2, 2021, 15 pages.

Notice of Allowance for U.S. Appl. No. 16/263,368, dated Apr. 29, 2021, 7 pages.

Notice of Allowance for U.S. Appl. No. 16/689,417, dated Feb. 24, 2021, 7 pages.

Non-Final Office Action for U.S. Appl. No. 17/027,963, dated Aug. 13, 2021, 6 pages.

Notice of Allowance for U.S. Appl. No. 16/689,236, dated Jun. 9, 2021, 7 pages.

Non-Final Office Action for U.S. Appl. No. 16/669,728, dated Jun. 3, 2021, 9 pages.

\* cited by examiner

ENVELOPE TRACKING APPARATUS

RELATED APPLICATIONS

This application claims the benefit of provisional patent application Ser. No. 62/837,876, filed Apr. 24, 2019, the disclosure of which is hereby incorporated herein by reference in its entirety.

FIELD OF THE DISCLOSURE

The technology of the disclosure relates generally to millimeter wave (mmWave) radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation (5G) new radio (NR) (5G-NR) wireless communication technology has been widely regarded as the next wireless communication standard beyond the current third-generation (3G) communication standard, such as wideband code division multiple access (WCDMA), and fourth-generation (4G) communication standard, such as long-term evolution (LTE). As such, a 5G-NR capable mobile communication device is expected to achieve significantly higher data rates, improved coverage range, enhanced signaling efficiency, and reduced latency compared to a conventional mobile communication device supporting only the 3G and 4G communication standards.

The 5G-NR capable mobile communication device can be configured to transmit an RF signal(s) in a millimeter wave (mmWave) radio frequency (RF) spectrum(s), such as a RF spectrum above 28 GHz. RF signals transmitted in the mmWave RF spectrum are susceptible to attenuation and interference. In this regard, the 5G-NR capable mobile communication device typically employs an amplifier array and an antenna array to shape the RF signal(s) into a directional RF beam(s) for transmission in the mmWave RF spectrum(s). Depending on the application scenarios supported by the 5G-NR capable mobile communication device, the amplifier array may be configured to include from tens to hundreds of power amplifiers. Notably, power amplifiers in the amplifier array can generate excessive heat when operating at suboptimal efficiency. As such, it may be desirable to improve operating efficiency of the amplifier array to help reduce heat dissipation in the 5G-NR capable mobile communication device.

SUMMARY

Embodiments of the disclosure relate to an envelope tracking (ET) apparatus. The ET apparatus includes an amplifier array(s) configured to amplify a radio frequency (RF) signal(s) based on an ET voltage(s). The ET apparatus also includes a distributed voltage amplifier (DVA) circuit(s), which may be co-located with the amplifier array(s) to help reduce trace inductance between the DVA circuit(s) and the amplifier array(s), configured to generate the ET voltage(s) based on an ET target voltage(s). The ET apparatus further includes a signal processing circuit configured to receive an analog signal(s) corresponding to the RF signal(s) and generates the ET target voltage(s) based on the analog signal. By employing a single signal processing circuit to generate the ET target voltage(s) for the amplifier array(s), it may be possible to reduce a footprint of the ET apparatus without compromising efficiency and/or increasing heat dissipation of the amplifier array(s).

In one aspect, an ET apparatus is provided. The ET apparatus includes an amplifier array including a number of amplifier circuits configured to amplify an RF signal based on an ET voltage. The ET apparatus also includes a DVA circuit configured to generate the ET voltage based on an ET target voltage. The ET apparatus also includes a signal processing circuit. The signal processing circuit is configured to receive an analog signal corresponding to the RF signal. The signal processing circuit is also configured to determine a time-variant signal envelope associated with the analog signal. The signal processing circuit is also configured to generate the ET target voltage based on the time-variant signal envelope.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) apparatus. The ET apparatus includes an amplifier array(s) configured to amplify a radio frequency (RF) signal(s) based on an ET voltage(s). The ET apparatus also includes a distributed voltage amplifier (DVA) circuit(s), which may be co-located with the amplifier array(s) to help reduce trace inductance between the DVA circuit(s) and the amplifier array(s), configured to generate the ET voltage(s) based on an ET target voltage(s). The ET apparatus further includes a signal processing circuit configured to receive an analog signal(s) corresponding to the RF signal(s) and generates the ET target voltage(s) based on the analog signal. By employing a single signal processing circuit to generate the ET target voltage(s) for the amplifier array(s), it may be possible to reduce a footprint of the ET apparatus without compromising efficiency and/or increasing heat dissipation of the amplifier array(s).

Figure 1:
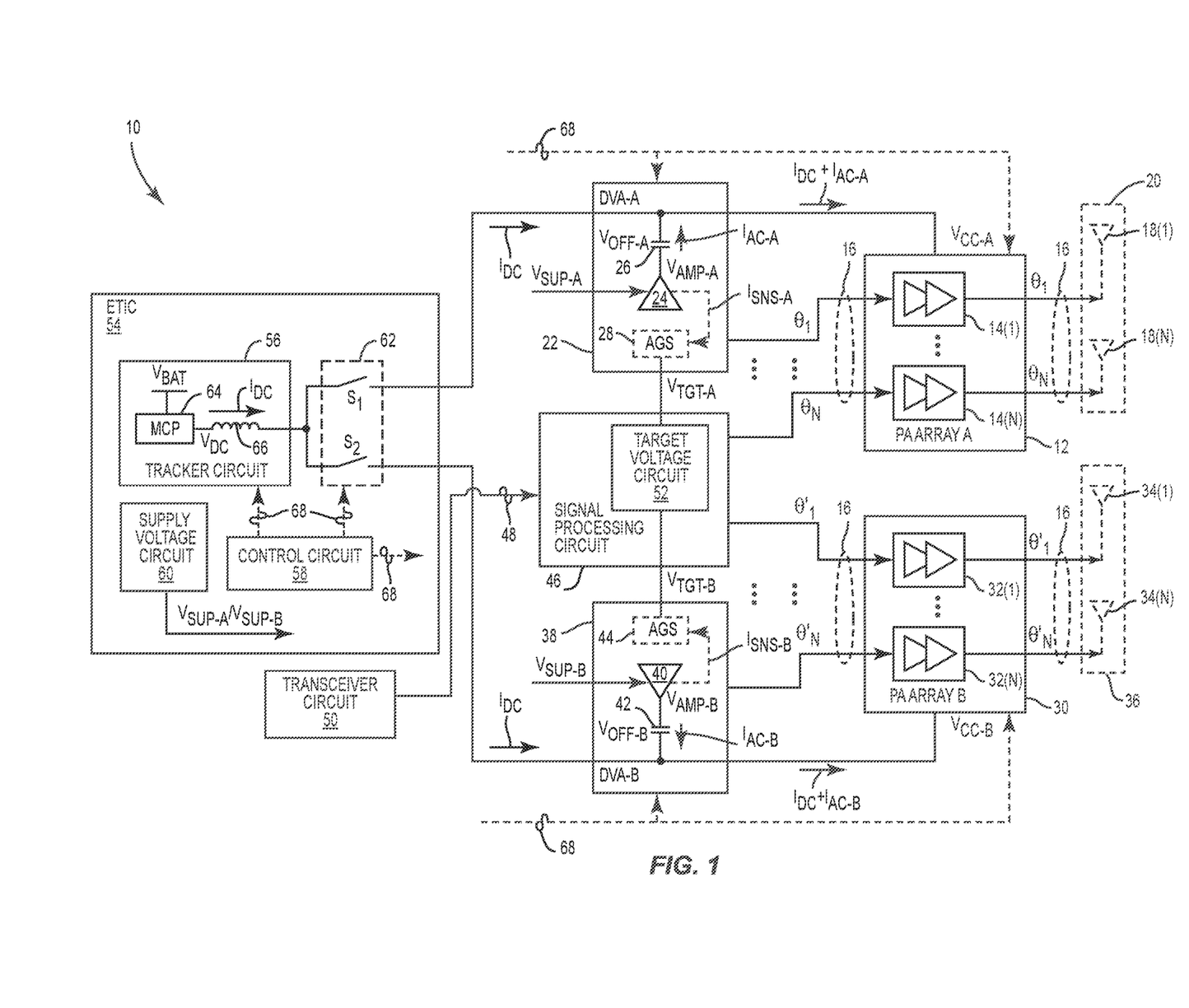
FIG. 1 is a schematic diagram of an exemplary ET apparatus configured according to an embodiment of the present disclosure.

In this regard, FIG. 1 is a schematic diagram of an exemplary ET apparatus 10 configured according to an embodiment of the present disclosure. The ET apparatus 10 includes an amplifier array 12 (denoted as "PA Array A").

The amplifier array 12 includes a number of amplifier circuits 14(1)-14(N) configured to amplify an RF signal 16 based on an ET voltage $V_{CC-A}$. The amplifier circuits 14(1)-14(N) may be coupled to a number of antennas 18(1)-18(N) (e.g., dipole antennas or patch antennas) in an antenna array 20, respectively. The antennas 18(1)-18(N) can be configured to radiate the RF signal 16 simultaneously. As such, the ET apparatus 10 can be configured to support RF beamforming and/or multiple input multiple output (MIMO) in a fifth-generation (5G) millimeter wave (mmWave) frequency (e.g., 28 GHz).

Notably, the RF signal 16 radiated from the antennas 18(1)-18(N) may propagate to a receiver circuit (not shown) via different propagation paths. As a result, the RF signal 16 radiated from the antennas 18(1)-18(N) may experience different propagation delays when arriving at the receiver circuit, thus making it difficult to linearly combine the RF signal 16 radiated from the antennas 18(1)-18(N) at the receiver circuit. As such, the RF signal 16 may be pre-processed to correspond to a number of phases $\theta_1$-$\theta_N$ configured to compensate for the different propagation delays such that the RF signal 16 radiated from the antennas 18(1)-18(N) may arrive at the receiver circuit at approximately the same time. In this regard, the amplifier circuits 14(1)-14(N) are configured to amplify the RF signal 16 corresponding to the phases $\theta_1$-$\theta_N$, respectively.

The ET apparatus 10 includes a distribute voltage amplifier (DVA) circuit 22 (denoted as "DVA-A") configured to generate the ET voltage $V_{CC-A}$ based on an ET target voltage $V_{TGT-A}$. More specifically, the DVA circuit 22 includes a voltage amplifier 24 and an offset capacitor 26. The voltage amplifier 24 is configured to generate an initial ET voltage $V_{AMP-A}$ based on the ET target voltage $V_{TGT-A}$ and a supply voltage $V_{SUP-A}$. The offset capacitor 26 is configured to raise the initial ET voltage $V_{AMP-A}$ by an offset voltage $V_{OFF-A}$ to generate the ET voltage $V_{CC-A}$ ($V_{CC-A}=V_{AMP-A}+V_{OFF-A}$). Accordingly, the DVA circuit 22 provides the ET voltage $V_{CC-A}$ to the amplifier circuits 14(1)-14(N) in the amplifier array 12 for amplifying the RF signal 16 in the phases $\theta_1$-$\theta_N$. In addition, the voltage amplifier 24 may source a high-frequency current (e.g., an alternating current) $I_{AC-A}$ and provide the high-frequency current $I_{AC-A}$ to the amplifier circuits 14(1)-14(N) in the amplifier array 12. Accordingly, the voltage amplifier 24 may generate a sense current $I_{SNS-A}$ as an indicator of the high-frequency current $I_{AC-A}$ sourced by the voltage amplifier 24.

The DVA circuit 22 may include an average gain scaling (AGS) circuit 28 (denoted as "AGS") coupled to the voltage amplifier 24. The AGS circuit 28 may be configured to determine an average load impedance variation among the amplifier circuits 14(1)-14(N) in the amplifier array 12. In a non-limiting example, the AGS circuit 28 can receive the sense current $I_{SNS-A}$ and determine the average load impedance variation based on the sense current $I_{SNS-A}$. Accordingly, the AGS circuit 28 may scale the ET voltage $V_{TGT-A}$ based on the average load impedance variation.

The ET apparatus 10 may include a second amplifier array 30 (denoted as "PA Array B"). The amplifier array 12 includes a number of second amplifier circuits 32(1)-32(N) configured to amplify the RF signal 16 based on a second ET voltage $V_{CC-B}$. The second amplifier circuits 32(1)-32(N) may be coupled to a number of second antennas 34(1)-34(N) (e.g., dipole antennas or patch antennas) in a second antenna array 36, respectively. The second antennas 34(1)-34(N) can be configured to radiate the RF signal 16 simultaneously Notably, the RF signal 16 radiated from the second antennas 34(1)-34(N) may propagate to the receiver circuit via different propagation paths. As a result, the RF signal 16 radiated from the second antennas 34(1)-34(N) may experience different propagation delays when arriving at the receiver circuit, thus making it difficult to linearly combine the RF signal 16 radiated from the second antennas 34(1)-34(N) at the receiver circuit. As such, the RF signal 16 may be pre-processed to correspond to a number of second phases $\theta'_1$-$\theta'_N$ configured to compensate for the different propagation delays such that the RF signal 16 radiated from the second antennas 34(1)-34(N) may arrive at the receiver circuit at approximately the same time. In this regard, the second amplifier circuits 32(1)-32(N) are configured to amplify the RF signal 16 corresponding to the second phases $\theta'_1$-$\theta'_N$, respectively.

The ET apparatus 10 includes a second DVA circuit 38 (denoted as "DVA-B") configured to generate the second ET voltage $V_{CC-B}$ based on a second ET target voltage $V_{TGT-B}$. More specifically, the second DVA circuit 38 includes a second voltage amplifier 40 and a second offset capacitor 42. The second voltage amplifier 40 is configured to generate a second initial ET voltage $V_{AMP-B}$ based on the second ET target voltage $V_{TGT-B}$ and a second supply voltage $V_{SUP-B}$. The second offset capacitor 42 is configured to raise the second initial ET voltage $V_{AMP-B}$ by a second offset voltage $V_{OFF-B}$ to generate the second ET voltage $V_{CC-B}$ ($V_{CC-B}$ = $V_{AMP-B}$+$V_{OFF-B}$). Accordingly, the second DVA circuit 38 provides the second ET voltage $V_{CC-B}$ to the second amplifier circuits 32(1)-32(N) in the second amplifier array 30 for amplifying the RF signal 16 in the second phases $\theta'_1$-$\theta'_N$. In addition, the second voltage amplifier 40 may source a second high-frequency current (e.g., an alternating current) $I_{AC-B}$ and provide the second high-frequency current $I_{AC-B}$ to the second amplifier circuits 32(1)-32(N) in the second amplifier array 30. Accordingly, the second voltage amplifier 40 may generate a second sense current $I_{SNS-B}$ as an indicator of the second high-frequency current $I_{AC-B}$ sourced by the second voltage amplifier 40.

The second DVA circuit 38 may include a second AGS circuit 44 (denoted as "AGS") coupled to the second voltage amplifier 40. The second AGS circuit 44 may be configured to determine a second average load impedance variation among the second amplifier circuits 32(1)-32(N) in the second amplifier array 30. In a non-limiting example, the second AGS circuit 44 can receive the second sense current $I_{SNS-B}$ and determine the second average load impedance variation based on the second sense current $I_{SNS-B}$. Accordingly, the second AGS circuit 44 may scale the second ET voltage $V_{TGT-B}$ based on the second average load impedance variation.

Although the ET apparatus 10 as illustrated in FIG. 1 includes only the amplifier array 12, the DVA circuit 22, the second amplifier array 30, and the second DVA circuit 38, it should be appreciated that it may be possible to include additional amplifier arrays and thus additional DVA circuits in the ET apparatus 10 without changing operational principles discussed herein. It should also be appreciated that the amplifier array 12, the DVA circuit 22, the second amplifier array 30, and the second DVA circuit 38 can be provided in separate dies, such as system-on-chip (SoC), or be integrated into a single die (e.g., SoC).

The ET apparatus 10 includes a signal processing circuit 46 configured to receive an analog signal 48 corresponding to the RF signal 16. In a non-limiting example, the analog signal 48 is generated by a transceiver circuit 50 and provided to the signal processing circuit 46 in an intermediate frequency (e.g., 4 to 9 GHz). The signal processing circuit 46 is configured to upshift the analog signal 48 from the intermediate frequency to a carrier frequency (e.g., 28 GHz or 39 GHz) to generate the RF signal 16. In addition, the signal processing circuit 46 is also configured to phase shift the RF signal 16 into the phases $\theta_1$-$\theta_N$ and the second phases $\theta'_1$-$\theta'_N$. Accordingly, the signal processing circuit 46 provides the RF signal 16 in the phases $\theta_1$-$\theta_N$ and the RF signal 16 in the second phases $\theta_1$-$\theta_N$ to the amplifier array 12 and the second amplifier array 30, respectively.

Given that the analog signal 48 is provided from the transceiver circuit 50 to the signal processing circuit 46 in the intermediate frequency that is lower than the carrier frequency, the analog signal 48 may be less susceptible to distortions resulted from trace inductance. As such, the signal processing circuit 46 may be located farther away from the transceiver circuit 50. In contrast, since the RF signal 16 is provided from the signal processing circuit 46 to the amplifier array 12 and the second amplifier array 30 in the carrier frequency that is higher than the intermediate frequency, the RF signal 16 may be more susceptible to the distortions resulted from trace inductance. As such, it may be desirable to locate the signal processing circuit 46 closer to the amplifier array 12 and/or the second amplifier array 30. For example, the signal processing circuit 46 can be provided in close proximity to the amplifier array 12 such that a respective trace inductance between the signal processing circuit 46 and the amplifier array 12 can be reduced to lesser than a defined threshold, for example 0.1 micro-Henry (µH). Likewise, the signal processing circuit 46 can also be provided in close proximity to the second amplifier array 30 such that a respective trace inductance between the signal processing circuit 46 and the second amplifier array 30 can be reduced to lesser than the defined threshold (e.g., 0.1 µH).

It may be desirable to provide the DVA circuit 22 in close proximity to the amplifier array 12 such that a respective trace inductance between the DVA circuit 22 and the amplifier array 12 may be reduced to below the defined threshold (e.g., 0.1 µH) to help reduce potential distortion to the ET voltage $V_{CC-A}$. Likewise, it may also be desirable to provide the second DVA circuit 38 in close proximity to the second amplifier array 30 such that a respective trace inductance between the second DVA circuit 38 and the second amplifier array 30 may be reduced to below the defined threshold (e.g., 0.1 µH) to help reduce potential distortion to the second ET voltage $V_{CC-B}$.

The signal processing circuit 46 includes a target voltage circuit 52 configured to generate the ET target voltage $V_{TGT-A}$ and the second ET target voltage $V_{TGT-B}$ based on the analog signal 48. More specifically, the target voltage circuit 52 receives the analog signal 48 in the intermediate frequency and determines a time-variant signal envelope (not shown) associated with the analog signal 48. In a non-limiting example, the target voltage circuit 52 can be configured to determine a number of amplitudes (not shown) of the analog signal 48 and determine the time-variant signal envelope based on the determined amplitudes of the analog signal 48. Accordingly, the target voltage circuit 52 may generate the ET target voltage $V_{TGT-A}$ having a respective time-variant voltage envelope (not shown) configured to track (rise and fall) the time-variant signal envelope. Likewise, the target voltage circuit 52 may generate the second ET target voltage $V_{TGT-B}$ having a respective time-variant voltage envelope (not shown) configured to track (rise and fall) the time-variant signal envelope. The target voltage circuit 52 can be further configured to provide the ET target voltage $V_{TGT-A}$ and the second ET target voltage $V_{TGT-B}$ to the DVA circuit 22 and the second DVA circuit 38, respectively. By sharing the target voltage circuit 52 between the DVA circuit 22 and the second DVA circuit 38, it may be possible to reduce the footprint of the ET apparatus 10.

The ET apparatus 10 includes an ET integrated circuit (IC) (ETIC) 54. In a non-limiting example, the ETIC 54 includes a tracker circuit 56, a control circuit 58, a supply voltage circuit 60, and a switching circuit 62. The tracker circuit 56 may include a multi-level charge pump (MCP) 64 and a power inductor 66. The MCP 64 can be configured to generate a low-frequency voltage $V_{DC}$ (e.g., a constant voltage) at multiple voltage levels based on a battery voltage $V_{BAT}$. The power inductor 66 can be configured to induce a low-frequency current $I_{DC}$ (e.g., a direct current) based on the low-frequency voltage $V_{DC}$.

The switching circuit 62 includes a first switch $S_1$ coupled to the tracker circuit 56, the DVA circuit 22, and the amplifier array 12. The switching circuit 62 also includes a second switch $S_2$ coupled to the tracker circuit 56, the second DVA circuit 38, and the second amplifier array 30. As mentioned earlier, the ET apparatus 10 can be configured to include additional DVA circuit and amplifier arrays. Accordingly, the switching circuit 62 may be configured to include additional switches coupled to the additional DVA circuits and amplifier circuits.

The supply voltage circuit 60 is configured to generate the supply voltage $V_{SUP-A}$ and the second supply voltage $V_{SUP-B}$. Notably, the supply voltage circuit 60 can be configured to generate each of the supply voltage $V_{SUP-A}$ and the second supply voltage $V_{SUP-B}$ at different voltage levels.

The control circuit 58, which can be a microprocessor, a microcontroller, or a field-programmable gate array (FPGA) for example, is configured to control the tracker circuit 56, the supply voltage circuit 60, the switching circuit 62, the DVA circuit 22, the amplifier array 12, the second DVA circuit 38, and the second amplifier array 30. In a non-limiting example, the control circuit 58 can control the tracker circuit 56, the supply voltage circuit 60, the switching circuit 62, the DVA circuit 22, the amplifier array 12, the second DVA circuit 38, and the second amplifier array 30 via at least one control signal 68.

In a non-limiting example, the ET apparatus 10 can be provided in a mobile electronic device (e.g., a smartphone). Accordingly, the antenna array 20 and the second antenna array 36 may be provided on opposing edges (e.g., top edge and bottom edge) of the mobile electronic device to help mitigate a so-called hand-blocking effect. As such, the control circuit 58 may be configured to activate a selected amplifier array among the amplifier array 12 and the second amplifier array 30 for amplifying the RF signal 16. Accordingly, the control circuit 58 may be further configured to activate a selected DVA circuit coupled to the selected amplifier array among the DVA circuit 22 and the second DVA circuit 38.

For example, the control circuit 58 can be configured to activate the amplifier array 12 and the DVA circuit 22, while deactivating the second amplifier array 30 and the second DVA circuit 38. Accordingly, the control circuit 58 may close the first switch $S_1$ and open the second switch $S_2$ such that the tracker circuit 56 can provide the low-frequency voltage $V_{DC}$ and the low-frequency current $I_{DC}$ to the DVA circuit 22 (e.g., as the offset voltage $V_{OFF-A}$) and the amplifier array 12, respectively.

Alternatively, the control circuit 58 can be configured to activate the second amplifier array 30 and the second DVA circuit 38, while deactivating the amplifier array 12 and the DVA circuit 22. Accordingly, the control circuit 58 may open the first switch $S_1$ and close the second switch $S_2$ such that the tracker circuit 56 can provide the low-frequency voltage $V_{DC}$ and the low-frequency current $I_{DC}$ to the second DVA circuit 38 (e.g., as the second offset voltage $V_{OFF-B}$) and the second amplifier array 30, respectively.

Figure 2:
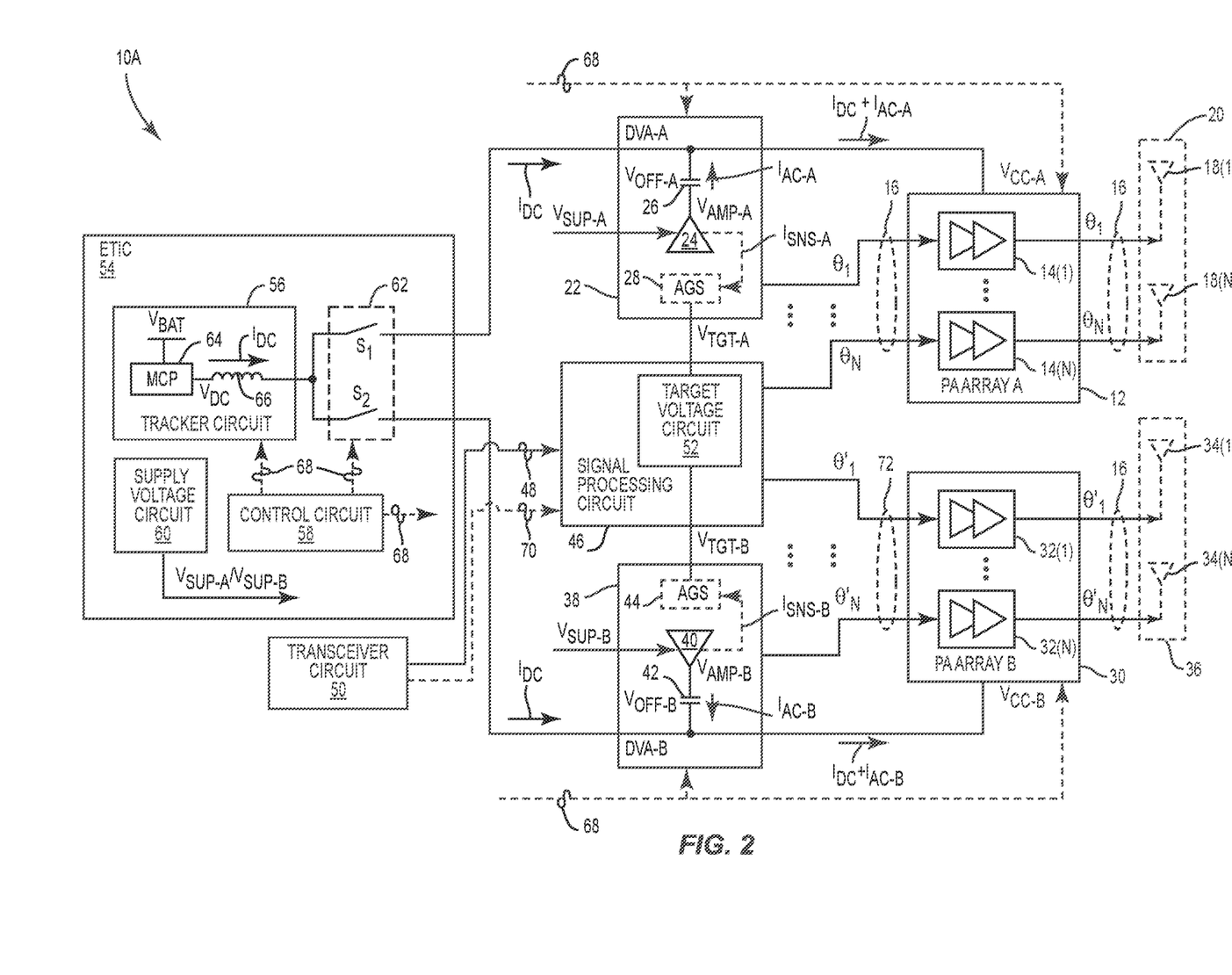
FIG. 2 is a schematic diagram of an exemplary ET apparatus configured according to another embodiment of the present disclosure.

FIG. 2 is a schematic diagram of an exemplary ET apparatus 10A configured according to another embodiment of the present disclosure. Common elements between FIGS. 1 and 2 are shown therein with common element numbers and will not be re-described herein.

The signal processing circuit 46 may be configured to receive a second analog signal 70 in the intermediate frequency from the transceiver circuit 50, in addition to receiving the analog signal 48. Accordingly, the signal processing circuit 46 upshifts the second analog signal 70 from the intermediate frequency to the carrier frequency to generate a second RF signal 72 in the second phases $\theta'_1$-$\theta'_N$ and provides the second RF signal 72 to the second amplifier array 30.

In a non-limiting example, the analog signal 48 can correspond to a first antenna polarization (e.g., horizontal polarization) and the second analog signal 70 can correspond to a second antenna polarization (e.g., vertical polarization) perpendicular to the first antenna polarization. In this regard, the antennas 18(1)-18(N) may be dipole antennas configured to radiate the RF signal 16 in the first polarization and the second antennas 34(1)-34(N) may be the same dipole antennas configured to radiate the second RF signal 72 in the second polarization.

In this embodiment, the target voltage circuit 52 is configured to receive the second analog signal 70, in addition to receiving the analog signal 48. The target voltage circuit 52 may detect a number of second amplitudes (not shown) of the second analog signal 70 and determine a second time-variant signal envelope (not shown) based on the detected second amplitudes of the second analog signal 70. Accordingly, the target voltage circuit 52 can generate the second ET target voltage $V_{TGT-B}$ based on the second time-variant signal envelope and provide the second ET target voltage $V_{TGT-B}$ to the second DVA circuit 38.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) apparatus comprising:
   an amplifier array comprising a plurality of amplifier circuits configured to amplify a radio frequency (RF) signal based on an ET voltage;
   a distributed voltage amplifier (DVA) circuit comprising:
      a voltage amplifier configured to generate an initial ET voltage based on an ET target voltage and a supply voltage; and
      an offset capacitor configured to raise the initial ET voltage by an offset voltage to generate the ET voltage; and
   a signal processing circuit configured to:
      receive an analog signal corresponding to the RF signal;
      determine a time-variant signal envelope associated with the analog signal; and
      generate the ET target voltage based on the time-variant signal envelope.

2. The ET apparatus of claim 1, wherein the DVA circuit further comprises an average gain scaling (AGS) circuit configured to:

determine an average load impedance variation among the plurality of amplifier circuits in the amplifier array; and scale the ET target voltage based on the determined average load impedance variation.

3. The ET apparatus of claim 1, further comprising:

a second amplifier array comprising a plurality of second amplifier circuits configured to amplify the RF signal based on a second ET voltage; and a second DVA circuit configured to generate the second ET voltage based on a second ET target voltage.

4. The ET apparatus of claim 3, wherein the second DVA circuit comprises:

a second voltage amplifier configured to generate a second initial ET voltage based on the second ET target voltage and a second supply voltage; and a second offset capacitor configured to raise the second initial ET voltage by a second offset voltage to generate the second ET voltage.

5. The ET apparatus of claim 4, wherein the second DVA circuit further comprises a second AGS circuit configured to:

determine a second average load impedance variation among the plurality of second amplifier circuits in the second amplifier array; and scale the second ET target voltage based on the determined second average load impedance variation.

6. The ET apparatus of claim 4, wherein the signal processing circuit is further configured to generate the second ET target voltage based on the time-variant signal envelope.

7. The ET apparatus of claim 6, wherein the signal processing circuit is further configured to:

receive the analog signal in an intermediate frequency; and convert the analog signal into the RF signal in a carrier frequency higher than the intermediate frequency.

8. The ET apparatus of claim 7, wherein:

the signal processing circuit is further configured to generate the RF signal in a plurality of phases and a plurality of second phases;

the plurality of amplifier circuits is further configured to amplify the RF signal in the plurality of phases, respectively, based on the ET voltage; and the plurality of second amplifier circuits is further configured to amplify the RF signal in the plurality of second phases, respectively, based on the second ET voltage.

9. The ET apparatus of claim 7, wherein the signal processing circuit comprises a target voltage circuit configured to:

receive the analog signal in the intermediate frequency;

detect a plurality of amplitudes of the analog signal;

determine the time-variant signal envelope based on the plurality of amplitudes of the analog signal; and generate the ET target voltage and the second ET target voltage each having a respective time-variant voltage envelope configured to track the time-variant signal envelope.

10. The ET apparatus of claim 9, further comprising an ET integrated circuit (IC) (ETIC) comprising:

a tracker circuit configured to generate a low-frequency voltage and a low-frequency current; and a control circuit configured to:

activate a selected amplifier array among the amplifier array and the second amplifier array for amplifying the RF signal; and activate a selected DVA circuit coupled to the selected amplifier array among the DVA circuit and the second DVA circuit.

11. The ET apparatus of claim 10, wherein the tracker circuit comprises:

a multi-level charge pump (MCP) configured to generate the low-frequency voltage based on a battery voltage; and a power inductor configured to induce the low-frequency current based on the low-frequency voltage.

12. The ET apparatus of claim 11, wherein the ETIC further comprises:

a first switch coupled to the power inductor, the DVA circuit, and the amplifier array; and a second switch coupled to the power inductor, the second DVA circuit, and the second amplifier array.

13. The ET apparatus of claim 12, wherein the control circuit is further configured to:

activate the amplifier array and the DVA circuit;

deactivate the second amplifier array and the second DVA circuit; and close the first switch and open the second switch to provide the low-frequency current and the low-frequency voltage to the amplifier array and the DVA circuit, respectively.

14. The ET apparatus of claim 12, wherein the control circuit is further configured to:

activate the second amplifier array and the second DVA circuit;

deactivate the amplifier array and the DVA circuit; and open the first switch and close the second switch to provide the low-frequency current and the low-frequency voltage to the second amplifier array and the second DVA circuit, respectively.

15. The ET apparatus of claim 12, wherein the ETIC further comprises a supply voltage circuit configured to generate the supply voltage and the second supply voltage.

16. The ET apparatus of claim 7, wherein the signal processing circuit is further configured to:

receive a second analog signal in the intermediate frequency; and convert the second analog signal into a second RF signal in the carrier frequency higher than the intermediate frequency.

17. The ET apparatus of claim 16, wherein:

the signal processing circuit is further configured to:

generate the RF signal in a plurality of phases; and generate the second RF signal in a plurality of second phases;

the plurality of amplifier circuits is further configured to amplify the RF signal in the plurality of phases, respectively, based on the ET voltage; and the plurality of second amplifier circuits is further configured to amplify the RF signal in the plurality of second phases, respectively, based on the second ET voltage.

18. The ET apparatus of claim 17, wherein the signal processing circuit comprises a target voltage circuit configured to:

receive the analog signal and the second analog signal in the intermediate frequency;

detect a plurality of amplitudes of the analog signal;

determine the time-variant signal envelope based on the plurality of amplitudes of the analog signal;

generate the ET target voltage based on the time-variant signal envelope;

detect a plurality of second amplitudes of the second analog signal;

determine a second time-variant signal envelope based on the plurality of second amplitudes of the second analog signal; and generate the second ET target voltage based on the second time-variant signal envelope.

19. The ET apparatus of claim 16, wherein:

the analog signal corresponds to a first antenna polarization; and the second analog signal corresponds to a second antenna polarization perpendicular to the first antenna polarization.

\* \* \* \* \*

UNITED STATES PATENT AND TRADEMARK OFFICE
CERTIFICATE OF CORRECTION

PATENT NO. : 11,139,780 B2  
APPLICATION NO. : 16/660900  
DATED : October 5, 2021  
INVENTOR(S) : Nadim Khlat Page 1 of 1

It is certified that error appears in the above-identified patent and that said Letters Patent is hereby corrected as shown below:

In the Specification

Column 4, Line 11, replace "(e.g., 28 GHz)" with --(e.g., $\geq$ 28 GHz)--

Signed and Sealed this  
Sixteenth Day of November, 2021

Drew Hirshfeld  
*Performing the Functions and Duties of the*  
*Under Secretary of Commerce for Intellectual Property and*  
*Director of the United States Patent and Trademark Office*